United States Patent
Chen et al.

(10) Patent No.: US 9,299,422 B1
(45) Date of Patent: *Mar. 29, 2016

(54) 6T STATIC RANDOM ACCESS MEMORY CELL, ARRAY AND MEMORY THEREOF

(71) Applicant: NATIONAL TSING HUA UNIVERSITY, Hsinchu (TW)

(72) Inventors: Chien-Fu Chen, Hsinchu (TW); Meng-Fan Chang, Taichung (TW); Hiroyuki Yamauchi, Fukuoka (JP); Yen-Yao Wang, Hsinchu (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/576,321

(22) Filed: Dec. 19, 2014

(51) Int. Cl.
  G11C 11/00 (2006.01)
  G11C 11/419 (2006.01)
  G11C 11/418 (2006.01)

(52) U.S. Cl.
  CPC ............ *G11C 11/419* (2013.01); *G11C 11/418* (2013.01)

(58) Field of Classification Search
  CPC .......................... G11C 11/419; G11C 11/418
  USPC .......... 365/49.1, 154, 156, 200, 201
  See application file for complete search history.

(56) References Cited

U.S. PATENT DOCUMENTS

| 5,365,475 | A * | 11/1994 | Matsumura | G11C 5/14 365/104 |
| 5,956,279 | A * | 9/1999 | Mo | G11C 29/34 365/185.09 |
| 6,385,081 | B1 * | 5/2002 | Shiomi | G11C 29/50 365/154 |
| 7,055,007 | B2 * | 5/2006 | Flautner | G06F 12/0893 711/137 |
| 9,001,571 | B1 * | 4/2015 | Chang | G11C 5/14 365/154 |
| 2012/0228714 | A1 * | 9/2012 | Lim | H01L 27/1104 257/369 |

* cited by examiner

*Primary Examiner* — Tha-O H Bui
(74) *Attorney, Agent, or Firm* — Li & Cai Intellectual Property (USA) Office (57) ABSTRACT

A 6T static random access memory cell, array, and memory thereof are provided, in which the memory cell includes a first inverter, a second inverter, a first access transistor, and a second access transistor. A first high supply voltage and a low supply voltage are coupled to the first inverter. A second high supply voltage and the low supply voltage are coupled to the second inverter. The first access transistor has a gate terminal coupled to a first word line. The first access transistor has a source terminal coupled to the first node. The second access transistor has a gate terminal coupled to a second word line, and the second access transistor has a source terminal coupled to the second node. The first word line provides ON signals to turn on the first access transistor, and the second high supply voltage provides a first differential voltage simultaneously.

20 Claims, 8 Drawing Sheets

6T STATIC RANDOM ACCESS MEMORY CELL, ARRAY AND MEMORY THEREOF

BACKGROUND OF THE INVENTION

1. Field of the Invention

The instant disclosure relates to a static random access memory cell; in particular, to a 6T static random access memory cell, array, and memory thereof.

2. Description of Related Art

In order to reduce required power consumption, minimizing the size of the integrated circuit memory devices in semiconductors is still the direction to strive for. Memory devices in semiconductors include static random access memory (SRAM) and dynamic random access memory (DRAM). DRAM memory cells only have one transistor and a capacitor, which provides high integrability. However, since DRAM requirement for continuous replacement, high power consumption and slow speed makes DRAM a memory choice limited to mostly computer memories. On the other hand, SRAM cells have bistability, which means with the appropriate power, SRAM can continuously maintain the original state. SRAM can operate in high speed under low power consumption such that computers mostly use a lot of cache SRAM. Other applications include embedded memory, and network device memory.

Conventional structures of common SRAM cells include six transistors (6T) having 6 MOS transistors. Please refer to FIG. 1 as a circuit diagram of a conventional 6T static random access memory cell. The conventional 6T static random access memory cell 1 includes a first inverter 11, a second inverter 12, a first access transistor M5, and a second access transistor M6. The first inverter 11 includes a first pull-up transistor M1 and a first pull-down transistor M3, whereas the second inverter 12 includes a second pull-up transistor M2 and a second pull-down transistor M4. The first pull-up transistor M1 has a source terminal and the second pull-up transistor M2 has a source terminal cooperatively coupled to a supply voltage VDD. The first pull-down transistor M3 has a source terminal and the second pull-down transistor M4 has a source terminal cooperatively coupled to a low supply voltage VSS. The first pull-down transistor M3 has a drain terminal and the first pull-up transistor M1 has a drain terminal cooperatively couple to form a first node Q. The second pull-down transistor M4 has a drain terminal and the second pull-up transistor M2 has a drain terminal cooperatively couple to form a second node QB.

Figure 1:
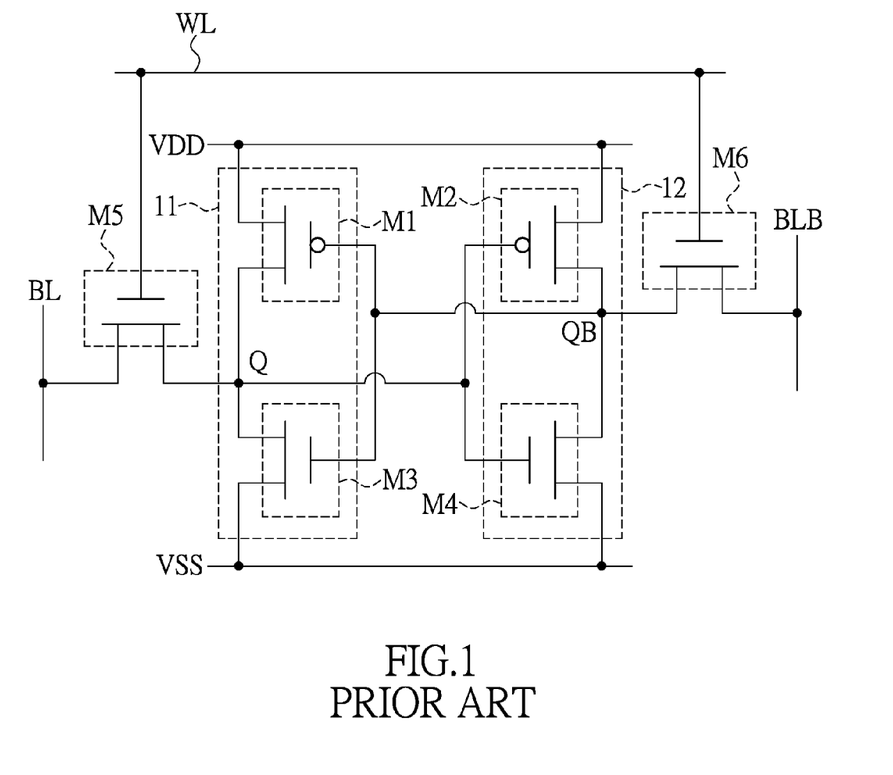
FIG. 1 is a circuit diagram of a conventional 6T static random access memory cell.

The first access transistor M5 has a gate terminal coupled to a word line WL, a source terminal coupled to the first node Q, and a drain terminal coupled to a first bit line BL. The second access transistor M6 has a gate terminal coupled to the word line WL, a source terminal coupled to the second node QB, and a drain terminal coupled to a second bit line BLB.

Figure 2:
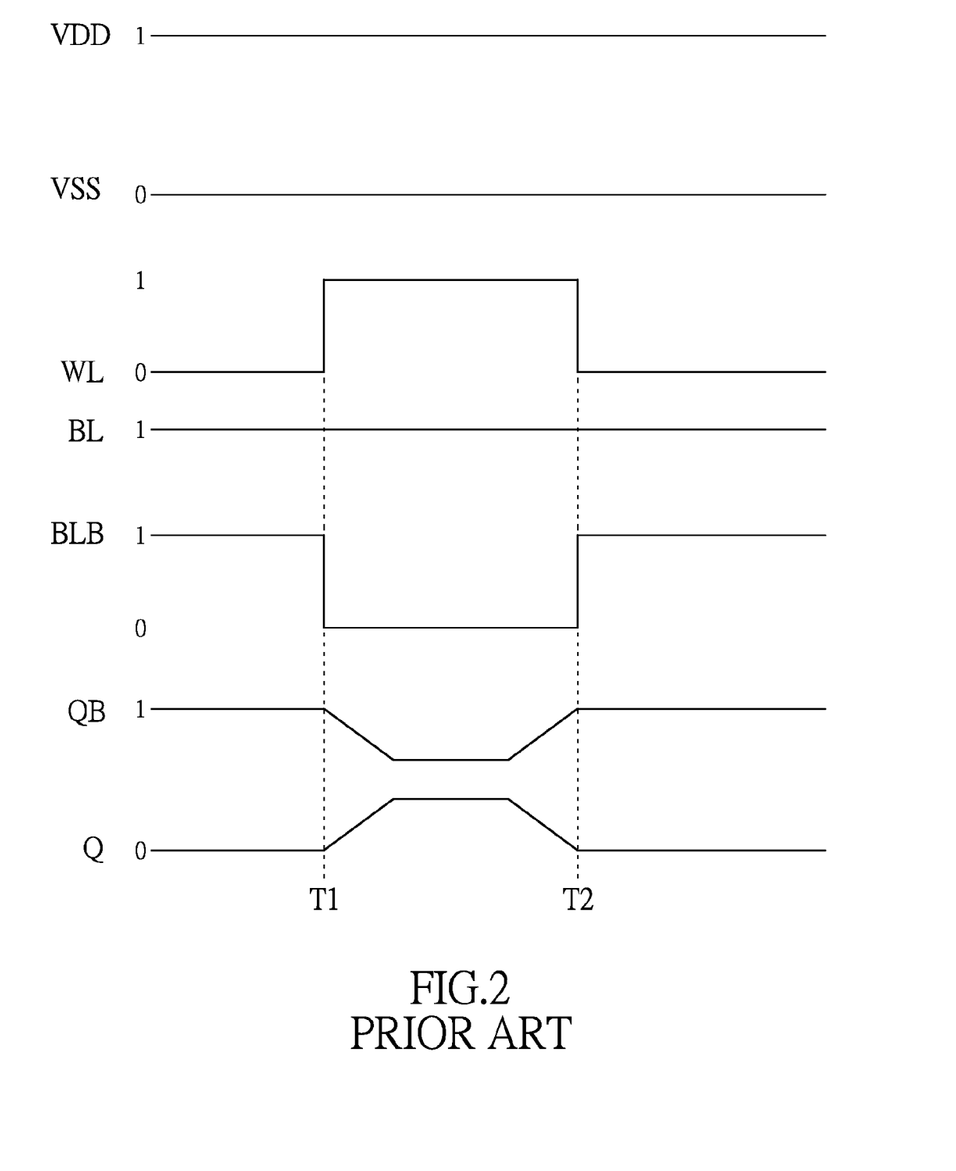
FIG. 2 is a signal diagram of the conventional 6T static random access memory cell while data are being written thereon.

Please refer to FIGS. 1 and 2. FIG. 2 is a signal diagram of the conventional 6T static random access memory cell while data are being written thereon. Generally, a conventional 6T static random access memory cell 1 must fix the first bit line BL and the second bit line BLB to a group of fixed voltage when data are being written, such that data stored in the first node Q and the second node QB are forced to flip.

Figure 3:
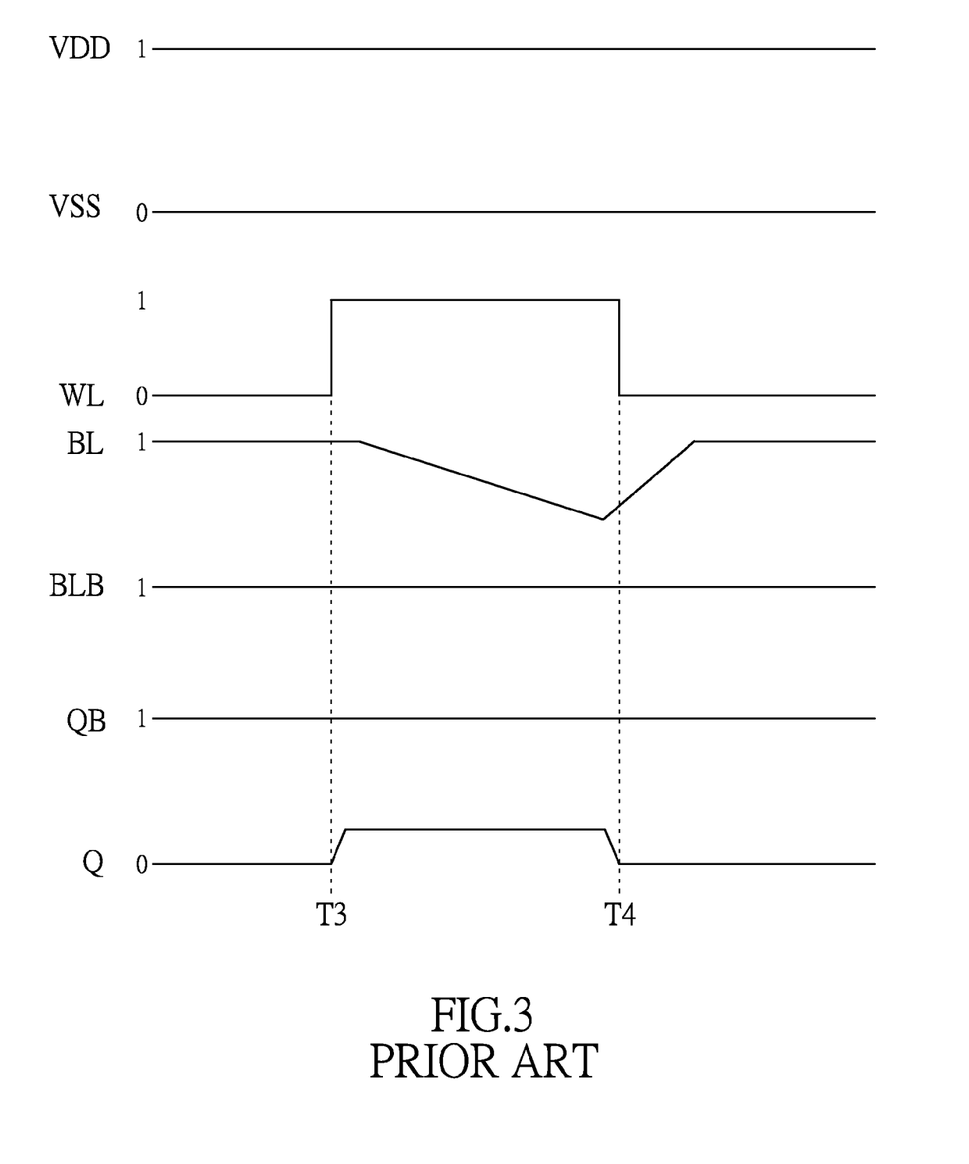
FIG. 3 is a signal diagram of the conventional 6T static random access memory cell while data are being read therefrom.

Please refer to FIGS. 1 and 3. FIG. 3 is a signal diagram of the conventional 6T static random access memory cell while data are being read therefrom. A conventional 6T static random access memory cell 1 must pull the electric potential of word line WL to "1" (refer to T3-T4 interval as shown in FIG. 3) when data is being read, which is different from writing, and the electric potential of the first bit line BL must pull up and equal to the second bit line BLB before the electric potential of the word line WL pulls up to "1", the first bit line BL and the second bit line BLB must have equal electric potentials such as "1" as shown in FIG. 3. When the first bit line BL is equal to the second bit line BLB and floating, the word line WL then provides ON signals. The conventional 6T static random access memory cell uses the storage values of the first node Q and the second node QB and, via the first access transistor M5 and the second access transistor M6, and generates charge sharing and voltage division respectively with the first bit line BL and the second bit line BLB, such that difference in electric potential is induced between the first bit line BL and the second bit line BLB. As shown in FIG. 3, electric potential signal of the first bit line BL is affected, thus voltage is reduced. Successively, external signal amplifier (not illustrated) amplifies differences in signals and read out voltage value as "0" or "1".

However, when the conventional 6T static random access memory cell 1 is reading data, the first node Q and the second node QB are prone to mutually interfere which prevent the stored values from smoothly flipping. As shown in FIG. 2, it is impossible to flip the voltage values of the first and second node Q, QB such that writing fails during time intervals T1 and T2. Moreover, as shown in FIG. 3, when the conventional 6T static random access memory cell 1 is reading, the voltage values of the first and second node Q, QB will mutually interfere in time intervals T3 and T4 due to voltage division. In turn, unexpected flipping of originally stored data might occur when data is being read, thus providing erroneous data. As a result, there is still much room for improvement in SRAM design.

To address the above issues, the inventor strives via associated experience and research to present the instant disclosure, which can effectively improve the limitation described above.

SUMMARY OF THE INVENTION

The object of the instant disclosure is to provide in an embodiment a 6T static random access memory cell which includes a first inverter, a second inverter, a first access transistor, and a second access transistor. The first inverter includes a first pull-up transistor and a first pull-down transistor. The second inverter includes a second pull-up transistor and a second pull-down transistor. The first pull-up transistor has a source terminal coupled to a first high supply voltage. The first pull-down transistor has a source terminal coupled to a low supply voltage. The first pull-down transistor has a drain terminal coupled to a drain terminal of the first pull-up transistor to form a first node. The second pull-up transistor has a source terminal coupled to a second high supply voltage. The second pull-down transistor has a source terminal coupled to the low supply voltage. The second pull-down transistor has a drain terminal coupled to a drain terminal of the second pull-up transistor to form a second node. The first access transistor has a gate terminal coupled to a first word line. The first access transistor has a source terminal coupled to the first node. The second access transistor has a gate terminal coupled to a second word line, and the second access transistor has a source terminal coupled to the second node. The first word line provides ON signals to turn on the first access transistor, and the second high supply voltage provides a first differential voltage simultaneously.

In an embodiment of the disclosure, a 6T static random access memory array is provided which includes a first memory cell. The first memory cell includes a first inverter, a second inverter, a first access transistor, and a second access transistor. The first inverter couples to a first high supply voltage and a low supply voltage. The first inverter has a first node. The second inverter couples to a second high supply voltage and the low supply voltage. The second inverter has a second node. The first access transistor has a gate terminal coupled to a first word line. The first access transistor has a source terminal coupled to the first node. The second access transistor has a gate terminal coupled to a second word line, and the second access transistor has a source terminal coupled to the second node. The first word line provides ON signals to turn on the first access transistor, and the second high supply voltage provides a first differential voltage simultaneously.

In another embodiment, a 6T static random access memory is provided which includes memory array. The memory array includes at least one memory cell. Each memory cell includes a first inverter, a second inverter, a first access transistor, and a second access transistor. The first inverter includes a first pull-up transistor and a first pull-down transistor. The second inverter includes a second pull-up transistor and a second pull-down transistor. The first pull-up transistor has a source terminal coupled to a first high supply voltage. The first pull-down transistor has a source terminal coupled to a low supply voltage. The first pull-down transistor has a drain terminal coupled to a drain terminal of the first pull-up transistor to form a first node. The second pull-up transistor has a source terminal coupled to a second high supply voltage. The second pull-down transistor has a source terminal coupled to the low supply voltage. The second pull-down has a drain terminal coupled to a drain terminal of the second pull-up transistor to form a second node. The first access transistor has a gate terminal coupled to a first word line. The first access transistor has a source terminal coupled to the first node. The second access transistor has a gate terminal coupled to a second word line, and the second access transistor has a source terminal coupled to the second node. The first word line provides ON signals to turn on the first access transistor, and the second high supply voltage provides a first differential voltage simultaneously.

Accordingly, with the 6T static random access memory cell, array and memory in accordance with the instant disclosure, storage values of the first node and the second node can be prevented from interference due to resistive division during reading or writing data. During data reading, convention circuitry must simultaneously provide voltage to a first access transistor and a second access transistor. However, the instant disclosure provides the memory cell, array, and memory that require only half the voltage of the convention circuitry would require to be provided to the first access transistor. Moreover, pairing of the first word line and the second high supply voltage can immediately obtain the storage value in the first node, which raises voltage effectively. Furthermore, the second word line of the instant disclosure does not provide signals because the storage value of the second node does not affect the storage value in the first node, which is relatively less prone to lose stored data. During writing, the first and second word lines are turned on separately in two different time intervals in order to write. While the first word line turns on during reading, the second high supply voltage also provides a differential voltage such that the stored value of the second node is relatively easier to be written compared to conventional arts. It is worth noting that the instant disclosure for FinFET (e.g., 4P2N circuit) utilizes the ground sensing to apply the memory cell accessing stability.

In order to further understand the instant disclosure, the following embodiments and illustrations are provided. However, the detailed description and drawings are merely illustrative of the disclosure, rather than limiting the scope being defined by the appended claims and equivalents thereof.

DETAILED DESCRIPTION OF THE PREFERRED EMBODIMENTS

The aforementioned illustrations and detailed descriptions are exemplarities for the purpose of further explaining the scope of the instant disclosure. Other objectives and advantages related to the instant disclosure will be illustrated in the subsequent descriptions and appended drawings. Terms such as "first, second, third, etc" are used to describe similar components or parts, but do not limit the amount or the order of importance of the components.

Figure 4:
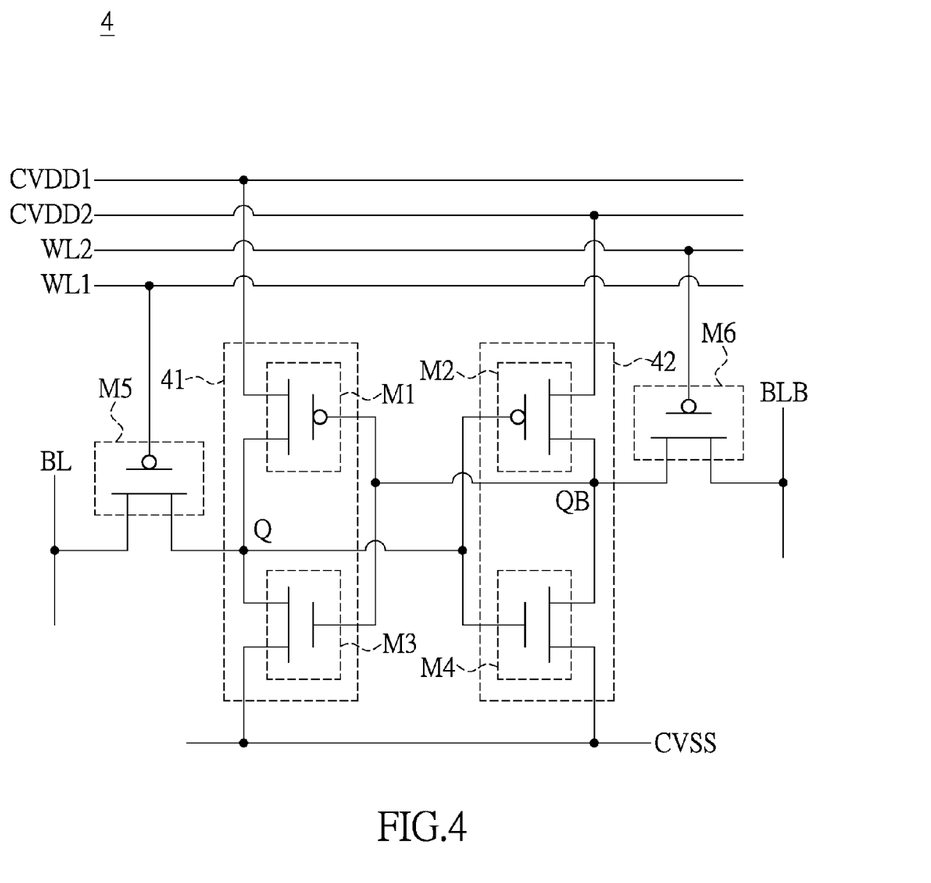
FIG. 4 is a circuit diagram of a 6T static random access memory cell in accordance with the instant disclosure.

Please refer to FIG. 4 as a circuit diagram of a 6T static random access memory cell in accordance with the instant disclosure. The 6T static random access memory cell 4 includes a first inverter 41, a second inverter 42, a first access transistor M5 and a second access transistor M6. The first inverter 41 includes a first pull-up transistor M1 and a first pull-down transistor M3. The second converter 42 includes a second pull-up transistor M2, and a second pull-down transistor M4.

The first pull-up transistor M1 has a source terminal coupled to a first high supply voltage CVDD1. The first pull-down transistor M3 has a source terminal coupled to a low supply voltage CVSS. The first pull-down transistor has a drain terminal coupled to a drain terminal of the first pull-up transistor to form a first node Q. The second pull-up transistor M2 has a source terminal coupled to a second high supply voltage CVDD2. The second pull-down transistor M4 has a source terminal coupled the low supply voltage CVSS. The second pull-down transistor M4 has a drain terminal coupled to a drain terminal of the second pull-up transistor M2 to form a second node QB. The first pull-down transistor M3 has a gate terminal, whereas the first pull-up transistor M1 has a gate terminal, and the two gate terminals are coupled to the second node QB. The second pull-down transistor M4 has a gate terminal, whereas the second pull-up transistor M2 has a gate terminal, and the two gate terminals are coupled to the first node Q. The first access transistor M5 has a gate terminal coupled to a first word line WL1, a source terminal coupled to the first node Q, and a drain terminal coupled to a first bit line BL. The second access transistor M6 has a gate terminal coupled to a second word line WL2, a source terminal coupled to the second node QB, and a drain terminal coupled to a second bit line BLB.

In the instant disclosure, the first inverter 41 and the second inverter 42 are CMOS static inverters, which are used for forming storage cells. As shown in FIG. 4, the first inverter 41 and the second inverter 42 are formed by two metal-oxide-semiconductor field-effect transistors or MOSFET, which are respectively used as the first pull-up transistor M1 and the first pull-down transistor M3, the second pull-up transistor M2 and the second pull-down transistor M4. The first pull-up transistor M1 and the second pull-up transistor M2, which are respectively connected to the first high supply voltage CVDD1 and the second high supply voltage CVDD2, are P-type metal-oxide-semiconductor or PMOS. The first pull-down transistor M3 and the second pull-down transistor M4, which are connected to the low supply voltage CVSS, are N-type metal-oxide-semiconductor or NMOS. However, the type of transistors, P or N type, are not limited to the arrangement provided in the examples herein. Specifically, the interleaving connection between the first inverter 41 and the second inverter 42 can form a flip-flop for storing data. For example: two different states such as (0, 1) or (1, 0). Notably, the two rounded bits of data information are stored as long as a source of power is continuously supplied thereto. If the power source is removed, the stored data will also be removed.

The first access transistor M5 and the second access transistor M6 are used for controlling the reading and writing of the storage cell. In the instant embodiment, the first access transistor M5 and the second access transistor M6 are P-type metal-oxide-semiconductors, but are not limited thereto. Specifically, the gate terminals of the first access transistor M5 and the second access transistor M6 are respectively coupled to the first word line WL1 and the second word line WL2. When the gate terminals of the first access transistor M5 and the second access transistor M6 receive ON signals through the first word line WL1 and second word line WL2, the first access transistor M5 and second access transistor M6 are turned on, such that the first bit line BL, the second bit line BLB, the first access transistor M5, and the second access transistor M6 mutually affect one another in order to read data from or write data into the memory cell.

Notably, the first high supply voltage CVDD1 and the second high supply voltage CVDD2 of the instant disclosure are two separate high voltage supplies, while the first word line WL1 and the second word line WL2 are similarly two separate ends providing ON signals.

Figure 5:
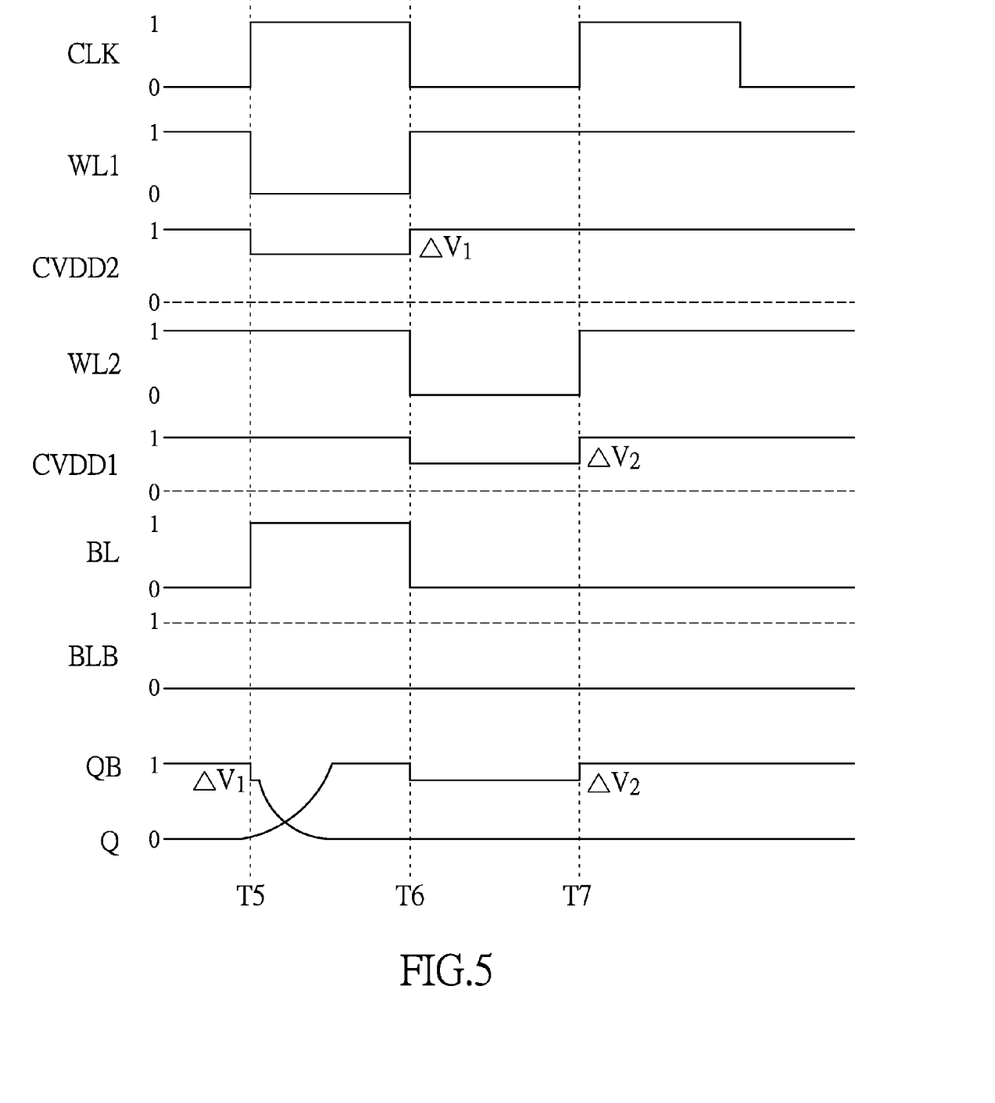
FIG. 5 is a signal diagram of the 6T static random access memory cell while data are being written thereon in accordance with the instant disclosure.

Please refer to FIGS. 4 and 5. FIG. 5 is a signal diagram of the 6T static random access memory cell while data are being written thereon in accordance with the instant disclosure. The following discloses the 6T static random access memory cell while data are being written as the signal changes with storage values variations for first node Q and the second node QB. It is worth noting that the memory cell in the embodiment of the present disclosure utilizes the ground sensing. In other words, the initial electric potential of the first word line WL1 and the second word line WL2 are in the logic high level voltage (as shown in FIG. 5, the first word line WL1 and the second word line WL2 before the time T5 are "1"), and the ON signals conduct the first access transistor M5 or second transistor M6 to cause the first word line WL1 and the second word line WL2 to change from the logic high level voltage to the logic low level voltage (as shown in FIG. 5, the values in the interval T5-T6 and interval T6-T7). Additionally, while data are being written, the initial electric potential of the first bit line BL is equal to the logic high level voltage "1" such as the first high supply voltage CVDD1 (or second supply voltage CVDD2), or the first high supply voltage CVDD1 plus the differential voltage $\Delta V_2$ (or the second high supply voltage CVDD2 plus the differential voltage $\Delta V_1$). The 6T static random access memory cell 4 of the instant disclosure has two writable cycles, as shown in FIG. 5. For example: The first node Q and the second node QB respectively begin with the storage values "0" and "1". If it is preferred to write from "0" to "1" in the first node Q, while writing from "1" to "0" in the second node QB, the voltage of the first bit line BL is preferably raised to 1, whereas the voltage of the second bit line BLB is preferably reduced to 0. Moreover, during the first writable cycle T5-T6, the first world line WL1 provides ON signals to the gate terminal of the first access transistor M5, and the second high supply voltage CVDD2 simultaneously provides a differential voltage $\Delta V_1$ to the second node QB. The first pull-up transistor M1, the second pull-up transistor M2, the first pull-down transistor M3, and the second pull-down transistor M4 changes the state of the first node Q storage value from "0" to "1" and second node QB storage value from "1" to "0". In the second writable cycle T6-T7, the second word line WL2 provides ON signals to the gate terminal of the second access transistor M6, and the first high supply voltage CVDD1 simultaneously provides a differential voltage $\Delta V_2$ to the first node Q.

In the embodiment of the present disclosure, the differential voltages $\Delta V_1$ and $\Delta V_2$ have the same voltage value. Moreover, the differential voltage $\Delta V_1$ and differential voltage $\Delta V_2$ can also be two different values in other embodiments. Since the stored values already flipped during the first writable cycle T5-T6, the state of stored values can be further checked during the second writable cycle T6-T7, which provides stability.

Please refer to FIGS. 2 and 5. Since the first word line WL1 and the second high supply voltage CVDD2 is turned on in different cycles in comparison to the second word line WL2 and the first high supply voltage CVDD1, the second high supply voltage CVDD2 and the first high supply voltage CVDD1 provide differential voltages $\Delta V_1$ and $\Delta V_2$ when the first node Q and the second node QB in FIGS. 2 and 5 are flipping. As a result, storage values are easier to write and the state of the storage values are more stable via the two writable cycles, which improves upon the errors produced during writing in the conventional 6T status random access memory.

Figure 6:
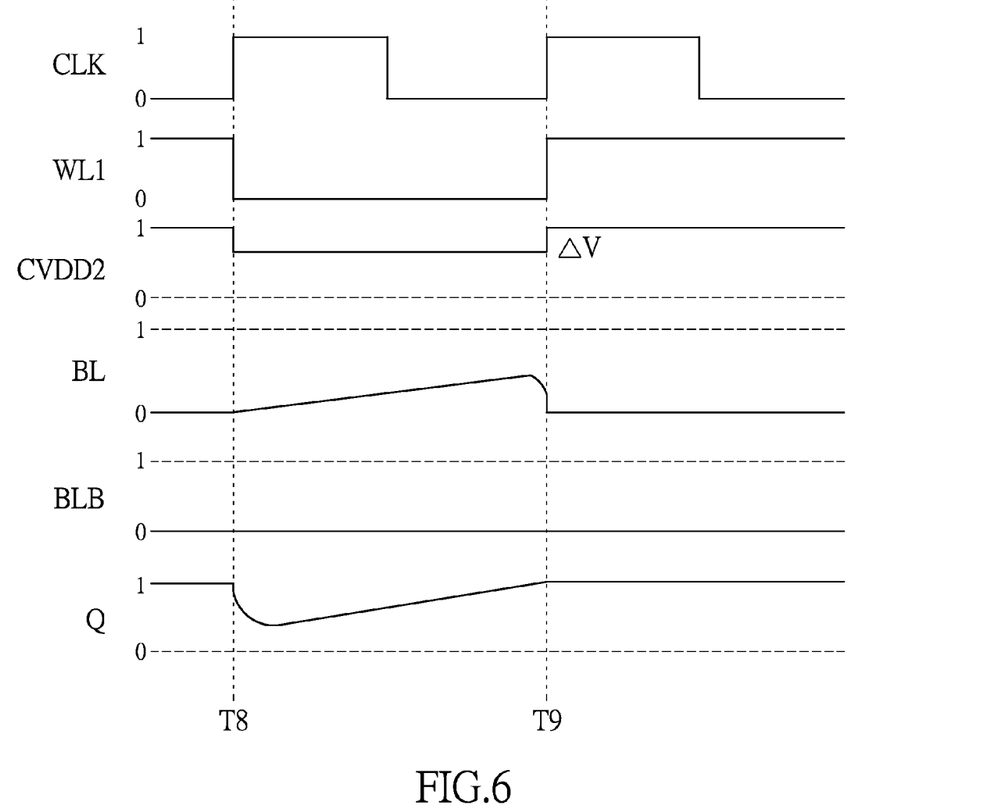
FIG. 6 is a signal diagram of the 6T static random access memory cell while data are being read therefrom in accordance with the instant disclosure.

Please refer to FIGS. 4 and 6. FIG. 6 is a signal diagram of the 6T static random access memory cell while data are read therefrom in accordance with the instant disclosure. The following discloses the 6T static random access memory cell 4 while data are read as the signal changes with storage values variations for first node Q and the second node QB. Similar to the conventional 6T static random access memory cell, the first bit line BL and the second bit line BLB must be at equal electric potential during the reading process. Notably, after the first bit line BL floats, the first word line WL1 only provides on signals, meanwhile the second high supply voltage CVDD2 provides a differential voltage $\Delta V$ in the instant embodiment. For example: when the storage value of the first node Q is at "0", the electric potential of the first bit line BL changes due to charge sharing or voltage division induced between the first access transistor M5 and the first bit line BL. As shown in FIG. 6, at time interval T8-T9, the electric potential of the first bit line BL is affected such that voltage is added.

Notably, since the second high supply voltage CVDD2 in the instant embodiment provides a differential voltage $\Delta V$, the voltage $V_{GS}$ from the gate terminal to the source terminal of the second pull-down transistor M4 is relatively smaller compared to the conventional 6T static random access memory cell 1, and the stored data are less prone to be lost. Please refer to FIGS. 3 and 6. During the generation of charge sharing of the first node Q as in FIG. 3, the 6T static random access memory cell of the instant disclosure differs from the conventional 6T static random access memory cell, which simultaneously uses the storage values of the first node Q and the second node QB and, via the first access transistor M5 and the second access transistor M6, generates charge sharing and voltage division respectively with the first bit line BL and the second bit line BLB, such that mutual interference is induced between the storage values of the first node Q and the second node QB. In order words, the 6T static random access memory cell of the instant disclosure executes data reading only via the first node Q and the second high supply voltage CVDD2. In turn, power consumption is relatively less with respect to the conventional cell, and mutual interferences between two nodes are prevented to minimize errors.

Moreover, the 6T static random access memory cell 4 of the present disclosure is particularly applied in the FinFET process (e.g., 4P2N circuit). However, the first high supply voltage CVDD1 and the second high supply voltage CVDD2 cooperating with ON signals of the second word line WL2 and the first word line WL1 increase stability to the 6T static random access memory cell 4.

Figure 7:
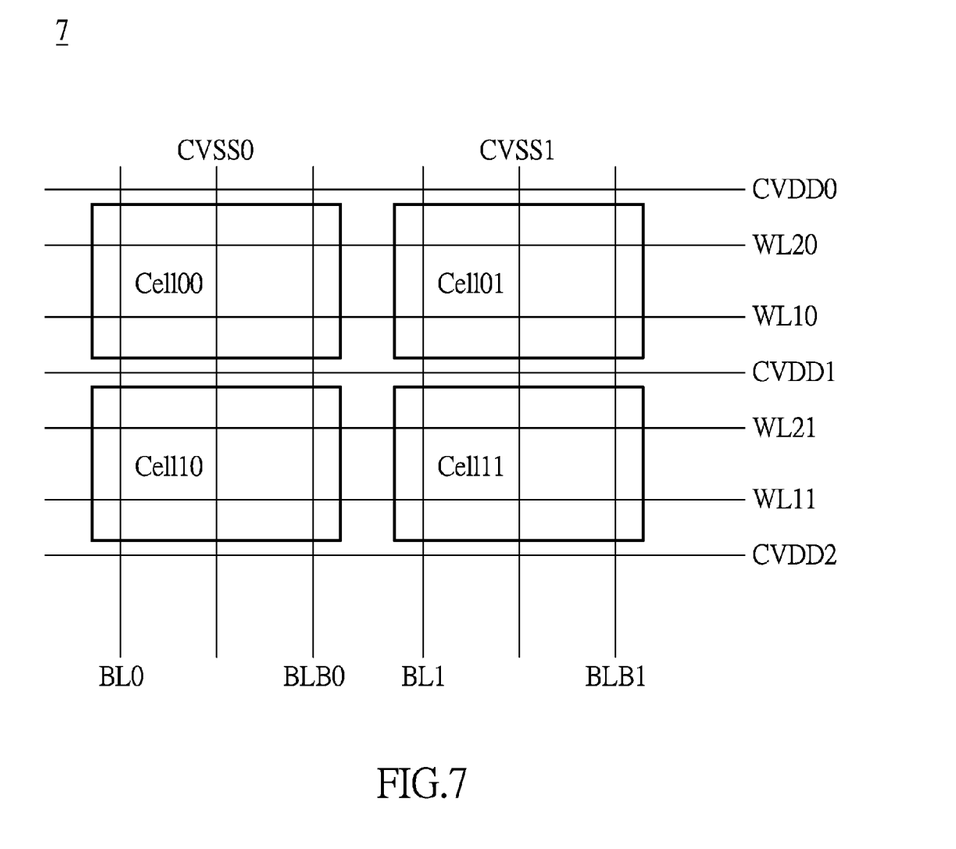
FIG. 7 is a schematic diagram of a 6T static random access memory array in accordance with the instant disclosure.

Please refer to FIG. 7 as a schematic diagram of a 6T static random access memory array in accordance with the instant disclosure. The 6T static random access memory array 7 has at least one of the 6T static random access memory cells Cell00, Cell01, Cell10, and Cell11 as aforementioned or simplified as memory cell hereafter.

In FIG. 7, the memory cells Cell00, Cell10 are coupled to the first low supply voltage CVSS0, the first bit line BL0 and the second bit line BLB0 along the vertical direction, whereas the memory cells Cell01, Cell11 are coupled to the second low supply voltage CVSS1, the third bit line BL1, and the fourth bit line BLB1 along the vertical direction. The memory cells Cell00, Cell01 are coupled to the first high supply voltage CVDD0, the second high supply voltage CVDD1, the first word line WL10, and the second word line WL20, whereas the memory cells Cell10, Cell11 are coupled to the second high supply voltage CVDD1, the third high supply voltage CVDD2, the third word line WL11, and the fourth word line WL21.

Please refer to FIGS. 4 and 7. Memory cell Cell00 has the first pull-up transistor M1, the first pull-down transistor M3, the second pull-up transistor M2, the second pull-down transistor M4, the first access transistor M5, and the second access transistor M6. The drain terminals of the first pull-up transistor M1 and the first pull-down transistor M3 are mutually coupled to form the first node Q, whereas the drain terminals of the second pull-up transistor M2 and the second pull-down transistor M4 are mutually coupled to form the second node QB. The gate terminals of the first pull-up transistor M1, the first pull-down transistor M3, and the second node QB are mutually coupled. The gate terminals of the second pull-up transistor M2, the second pull-down transistor M4, and the first node Q are mutually coupled. The gate terminal of the first access transistors M5 is coupled to the first word line WL10, the source terminal of the first access transistor M5 is coupled to the first node Q, the drain terminal of the first access transistor M5 is coupled to the first bit line BL0. The gate terminal of the second access transistor M6 is coupled to the second word line WL20, the source terminal of the second access transistor M6 is coupled to the second node QB, and the drain terminal of the second access transistor M6 is coupled to the second bit line BLB0. The source terminals of the first pull-up transistor M1 and the second pull-up transistor M2 of the memory cell Cell00 are respectively coupled to the first high supply voltage CVDD0 and the second supply voltage CVDD1. The first pull-down transistor M3 and the second pull-down transistor M4 are cooperatively coupled to the first low supply voltage CVSS0.

The structure of the memory cell Cell10 is similar to that of the memory cell Cell00, and the third and fourth units are only expressed in the memory cell Cell10. The memory cell Cell10 has the third pull-up transistor, the third pull-down transistor, the fourth pull-up transistor, the fourth pull-down transistor, the third access transistor, and the fourth access transistor. The drain terminal of the third pull-up transistor and the drain terminal of the third pull-down transistor mutually couple to form a third node, whereas the drain terminal of the fourth pull-up transistor and the drain terminal of the fourth pull-down transistor mutually couple to form a fourth node. The gate terminal of the third pull-down transistor, the gate terminal of the third pull-up transistor, and the fourth node are mutually coupled, whereas the gate terminal of the fourth pull-down transistor, the gate terminal of the fourth pull-up transistor, and the third node are mutually coupled. The gate terminal of the third access transistor is coupled to the third word line WL11, the source terminal of the third access transistor is coupled to the third node, and the drain terminal of the third access transistor is coupled to the first bit line BL0. The gate terminal of the fourth access transistor is coupled to the fourth word line WL21, the source terminal of the fourth access transistor is coupled to the fourth node, and the drain terminal of the fourth access transistor is coupled to the second bit line BLB0. The source terminal of the third pull-up transistor and the source terminal of the fourth pull-up transistor in the memory cell Cell10 are respectively coupled to the third high supply voltage CVDD2 and the second high supply voltage CVDD1. The third pull-down transistor and the fourth pull-down transistor in the memory cell Cell10 are cooperatively coupled to the first low supply voltage CVSS1.

Notably, the second pull-up transistor M2 of the memory cell Cell00 and the fourth pull-up transistor of the memory cell Cell10 are cooperatively coupled to the second high supply voltage CVDD1. Accordingly, when the third word line WL11 provides ON signals to turn on the third access transistor, the second high supply voltage CVDD1 simultaneously provides the second differential voltage to the fourth node. When the fourth word line WL21 provides ON signals to turn on the fourth access transistor, the third high supply voltage CVDD2 simultaneously provides the third differential voltage to the third node.

The 6T static random access memory array of the instant disclosure provides different high supply voltage to each memory cell, meanwhile a shared high supply voltage is provided between every two adjacent memory cells to further reduce surface area covered by electrical circuits and power consumption.

Figure 8:
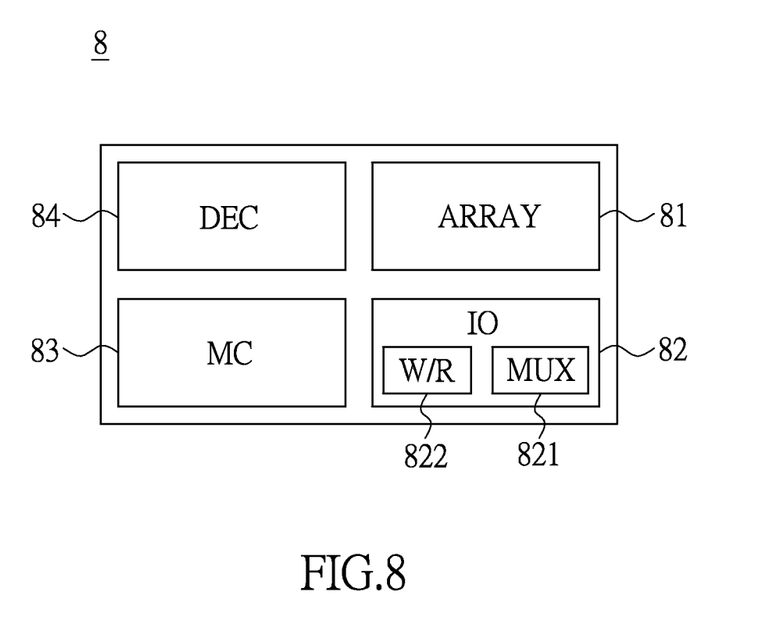
FIG. 8 is a block diagram of a 6T static random access memory in accordance with the instant disclosure.

Please refer to FIG. 8 as a block diagram of a 6T static random access memory in accordance with the instant disclosure. The 6T static random access memory 8 includes a decoding module (DEC) 84, a main control (MC) 83, an input output module (IO) 82, and the 6T static random access memory array 7 as aforementioned (simply known as memory array 81 hereafter). The input output module 82 includes a read-write circuit (W/R) 822 and a multiplex circuit (MUX) 821. The input output module 82 is coupled to the memory array 81, the main control 83 is coupled to decoding module 84 and the input output module 82. The decoding module 84, the main control 83, and the input output module 82 include appropriate logic, circuitry, and/or codes, or any processing unit or components having computing capacity, but is not limited hereto.

The input output module 82 can read from or write into the memory array 81 data. The decoding module 84 can decode the selected instruction address or addresses in the memory cell row of the memory array 81, while the main control 83 receives control signals from externally connected circuitry, such that the instruction addresses can be provided to the decoding module 84 or the input output module 82. The input output module 82 includes the read-write circuit 822 and the multiplex circuit 821. The read-write circuit 822 can write data into the memory cell or read data from the memory cell, and the multiplex circuit 821 can decode the selected instruction address or addresses in the memory cell row of the memory array.

In summary, with the 6T static random access memory cell, array and memory in accordance with the instant disclosure, storage values of the first node and the second node can be prevented from interference due to resistive division during reading or writing data. During data reading, convention circuitry must simultaneously provide voltage to a first access transistor and a second access transistor. However, the instant disclosure provides the memory cell, array, and memory that requires only half the voltage the convention circuitry would require to be provided to the first access transistor. Moreover, pairing of the first word line and the second high supply voltage can immediately obtain the storage value in the first node, which reduces voltage effectively. Furthermore, the second word line of the instant disclosure does not provide signals because the storage value of the second node does not affect the storage value in the first node, which is relatively less prone to lose stored data. During writing, the first and second word lines are turned on separately in two different time intervals in order to write. While the first word line turns on during reading, the second high supply voltage also provides a differential voltage such that the stored value of the second node is relative easier to be written compared to conventional arts. It is worth noting that instant disclosure for FinFET (e.g., 4P2N circuit) utilizes the ground sensing to apply the memory cell accessing stability.

The figures and descriptions supra set forth illustrate the preferred embodiments of the instant disclosure; however, the characteristics of the instant disclosure are by no means restricted thereto. All changes, alterations, combinations or modifications conveniently considered by those skilled in the art are deemed to be encompassed within the scope of the instant disclosure delineated by the following claims.

What is claimed is:

1. A 6T static random access memory cell, comprising:
   a first inverter, comprising:
      a first pull-up transistor having a source terminal coupled to a first high supply voltage;
      a first pull-down transistor having a source terminal coupled to a low supply voltage, the first pull-down transistor having a drain terminal coupled to a drain terminal of the first pull-up transistor to form a first node;
   a second inverter, comprising:
      a second pull-up transistor having a source terminal coupled to a second high supply voltage;
      a second pull-down transistor having a source terminal coupled to the low supply voltage, the second pull-down transistor having a drain terminal coupled to a drain terminal of the second pull-up transistor to form a second node;
   a first access transistor having a gate terminal coupled to a first word line, the first access transistor having a source terminal coupled to the first node; and
   a second access transistor having a gate terminal coupled to a second word line, the second access transistor having a source terminal coupled to the second node;
   wherein the first word line provides an ON signal to turn on the first access transistor, and the second high supply voltage provides a first differential voltage simultaneously.

2. The 6T static random access memory cell as recited in claim 1, wherein when the second word line provides the ON signal such that the second access transistor is turned on, the first high supply voltage provides a second differential voltage simultaneously.

3. The 6T static random access memory cell as recited in claim 1, wherein the first access transistor and the second access transistor are P-type metal-oxide-semiconductor (PMOS).

4. The 6T static random access memory cell as recited in claim 1, wherein the first access transistor has a drain terminal coupled to a first bit line, and the second access transistor has a drain terminal coupled to a second bit line.

5. The 6T static random access memory cell as recited in claim 2, wherein the first differential voltage is equal to the second differential voltage.

6. The 6T static random access memory cell as recited in claim 2, wherein before the ON signal is conducting the first access transistor or the second access transistor, an initialization electric potential of the first word line and the second word line is in a logic high level voltage.

7. The 6T static random access memory cell as recited in claim 6, wherein while data are being written, the initial electric potential of the first bit line is equal to or greater than the first high supply voltage.

8. A 6T static random access memory array, comprising:
   a first memory cell, comprising:
      a first inverter coupling to a first high supply voltage and a low supply voltage, and having a first node;
      a second inverter coupling to a second high supply voltage and the low supply voltage, and having a second node;
      a first access transistor having a gate terminal coupled to a first word line, the first access transistor having a source terminal coupled to the first node; and
      a second access transistor having a gate terminal coupled to a second word line, the second access transistor having a source terminal coupled to the second node;
   wherein the first word line provides an ON signal to turn on the first access transistor, and the second high supply voltage provides a first differential voltage simultaneously.

9. The 6T static random access memory array as recited in claim 8 further comprising:
   a second memory cell, comprising:
      a third inverter coupling to a third high supply voltage and the low supply voltage, and having a third node;
      a fourth inverter coupling to the second high supply voltage and the low supply voltage, and having a fourth node;
      a third access transistor having a gate terminal coupled to a third word line and a source terminal coupled to the third node; and
      a fourth access transistor having a gate terminal coupled to a fourth word line and a source terminal coupled to the fourth node;

wherein when the fourth word line provides the ON signal to turn on the fourth access transistor, the third high supply voltage provides a third differential voltage simultaneously.

10. The 6T static random access memory array as recited in claim 8, wherein when the second word line provides the ON signal to turn on the second access transistor, the first high supply voltage provides a second differential voltage simultaneously.

11. The 6T static random access memory array as recited in claim 8, wherein when the third word line provides the ON signal to turn on the third access transistor, the second high supply voltage provides a second differential voltage simultaneously.

12. The 6T static random access memory array as recited in claim 8, wherein the first access transistor has a drain terminal coupled to a first bit line, and the second access transistor has a drain terminal coupled to a second bit line.

13. The 6T static random access memory array as recited in claim 10, wherein the first differential voltage is equal to the second differential voltage.

14. A 6T static random access memory, comprising:
   a memory array, comprising:
      at least one memory cell, each comprising:
         a first inverter, comprising:
            a first pull-up transistor having a source terminal coupled to a first high supply voltage; and
            a first pull-down transistor having a source terminal coupled to a low supply voltage, the first pull-down transistor having a drain terminal coupled to a drain terminal of the first pull-up transistor to form a first node;
         a second inverter, comprising:
            a second pull-up transistor having a source terminal coupled to a second high supply voltage; and
            a second pull-down transistor having a source terminal coupled to the low supply voltage, the second pull-down transistor having a drain terminal coupled to a drain terminal of the second pull-up transistor to form a second node;
         a first access transistor having a gate terminal coupled to a first word line, the first access transistor having a source terminal coupled to the first node; and
         a second access transistor having a gate terminal coupled to a second word line, the second access transistor having a source terminal coupled to the second node; and
      an input output module coupled to the memory array to accessibly read from or write to data the memory array;
   wherein the first word line provides an ON signal to turn on the first access transistor, and the second high supply voltage provides a first differential voltage simultaneously.

15. The 6T static random access memory as recited in claim 14 further comprising:
   a decoding module coupled to the memory array for decoding an instruction address chosen from a row of the memory cell in the memory array.

16. The 6T static random access memory as recited in claim 15 further comprising:
   a main control coupled to the decoding module and the input output module for providing the instruction address.

17. The 6T static random access memory as recited in claim 14, wherein the input output module further comprising:
   a read-write circuit for a datum to be read from or written to the memory cell; and
   a multiplex circuit for decoding the instruction address chosen from a row of the memory cell in the memory array.

18. The 6T static random access memory as recited in claim 14, wherein when the second word line provides the ON signal to turn on the second access transistor, the first high supply voltage provides a second differential voltage.

19. The 6T static random access memory as recited in claim 14, wherein the first access transistor has a drain terminal coupled to a first bit line, and the second access transistor has a drain terminal coupled to a second bit line.

20. The 6T static random access memory as recited in claim 18, wherein the first differential voltage is equal to the second differential voltage.

* * * * *